United States Patent
Yamashita (10) Patent No.: US 8,022,852 B2
(45) Date of Patent: Sep. 20, 2011

(54) DIGITAL-ANALOG CONVERTER CIRCUIT

(75) Inventor: Keitaro Yamashita, Kobe (JP)

(73) Assignee: Chimei Innolux Corporation, Miao-Li County (TW)

( * ) Notice: Subject to any disclaimer, the term of this patent is extended or adjusted under 35 U.S.C. 154(b) by 685 days.

(21) Appl. No.: 12/188,863

(22) Filed: Aug. 8, 2008

(65) Prior Publication Data

US 2009/0040164 A1 Feb. 12, 2009

(30) Foreign Application Priority Data

Aug. 10, 2007 (JP) ................................ 2007-210168

(51) Int. Cl.
*H03M 1/66* (2006.01)
(52) U.S. Cl. ......................... 341/150; 345/212; 323/297
(58) Field of Classification Search .......... 341/144–170; 345/212, 210, 211, 89; 323/297, 313, 354
See application file for complete search history.

(56) References Cited

U.S. PATENT DOCUMENTS

| 7,071,669 B2 * | 7/2006 | Morita | 323/297 |
| 7,079,127 B2 * | 7/2006 | Morita | 345/212 |
| 7,307,569 B2 * | 12/2007 | Vrazel et al. | 341/144 |

* cited by examiner

*Primary Examiner* — Lam T Mai
(74) *Attorney, Agent, or Firm* — Morris Manning Martin LLP; Tim Tingkang Xia, Esq.

(57) ABSTRACT

This invention provides a digital-analog converter circuit capable of appropriately correcting the optical characteristics of the liquid crystals according to the change in design or the preference of the user, and achieving goals of miniaturization, cost-lowering, as well as wide design suitability. The digital-analog converter circuit includes a storage device for storing a voltage characteristic curve, a modulating device for generating a frequency signal in accordance with a data from the voltage characteristic curve stored in the storage device in response to a selected data, a variable resistance device connected between a first power source and a second power source, in which the resistance value of the variable resistance device is changed in accordance with the frequency signal from the modulating device, a holding device for holding a voltage generated at the variable resistance device, and an output device for outputting the voltage to a desired output end.

12 Claims, 12 Drawing Sheets

DIGITAL-ANALOG CONVERTER CIRCUIT

BACKGROUND OF THE INVENTION

1. Field of the Invention

The present invention relates to a digital-analog converter circuit. More particularly, the present invention relates to a digital-analog converter circuit, which is capable of generating a driving voltage according to a γ curve for correcting optical characteristic of liquid crystals.

2. Description of the Related Art

The liquid crystals are driven by changing a voltage applied thereupon. The relationship between driving voltages and the optical characteristic is generally non-linear. In order to correct this non-linear relationship, a γ voltage is provided to the liquid crystals. Such γ voltage in a low-temperature polysilicon (LTPS) liquid crystal display is constituted by a plurality of resistors in serial connection made on a glass substrate and a plurality of intermediate nodes between these resistors. A γ voltage corresponding to an input data can be extracted from such a structure. The γ voltages forms a voltage curve determined by the characteristic of the liquid crystals.

However, such a voltage curve is determined by the resistors in serial connection made with using an exposure mask, the resistors structure is fixed and cannot be changed anymore. Therefore, despite the change in the characteristic of the liquid crystals due to the change of their material under such condition, in order to change the value of the series resistors, the exposure mask must be remade. Furthermore, due to the optical characteristic of the liquid crystals themselves, the picture quality of the liquid crystals can be changed according to the preferences of the user. However, the conventional technique can not fulfill such demand. In addition, in order to fulfill various demands, respective γ voltage generators with different properties would become necessary, which is an obstacle for device miniaturization and cost reduction. Furthermore, this would worsen the design suitability derived from the concept that one design is applicable to various devices. The design compatibility for a plurality of devices would be difficult, and ultimately leading to the increase of cost.

SUMMARY OF THE INVENTION

The present invention is accomplished in order to solve such problem, and the objective is to provide a digital-analog converter circuit, which can appropriately correct the optical characteristic of the liquid crystals according to the change in design or the preference of user, and accomplish the goal of device miniaturization, cost-lowering, as well as wide design portability.

The present invention provides a digital-analog converter circuit comprising a storage device storing a voltage characteristic curve; a modulating device generating a frequency signal in accordance with a data from the voltage characteristic curve stored in the storage device in response to a selected data; a variable resistance device is connected between a first power source and a second power source, in which the resistance value of the variable resistance device is changed in accordance with the frequency signal from the modulating device; a holding device holding a voltage generated at the variable resistance device; and an output device outputting the voltage to a desired output end.

According to the present invention, the γ voltage value from the pre-stored characteristic curve can be freely determined by the modulating frequency, and thus the optical characteristic of the liquid crystals can be appropriately corrected according to the change of the design and the preference of user. In addition, since the change of the circuit design on the glass substrate corresponding to various γ voltage demands is not necessary, the objective of device miniaturization, cost down, and wide design suitability is achievable. Furthermore, by using a single γ voltage generating circuit, RGB independent driving, common AC driving . . . etc can be realized, which has high applicability.

DETAILED DESCRIPTION OF THE INVENTION

In the following section, some of the examples of the present invention will be described and explained with references to the drawings. Before the detailed descriptions of the present invention, the conventional structures is described.

Figure 1:
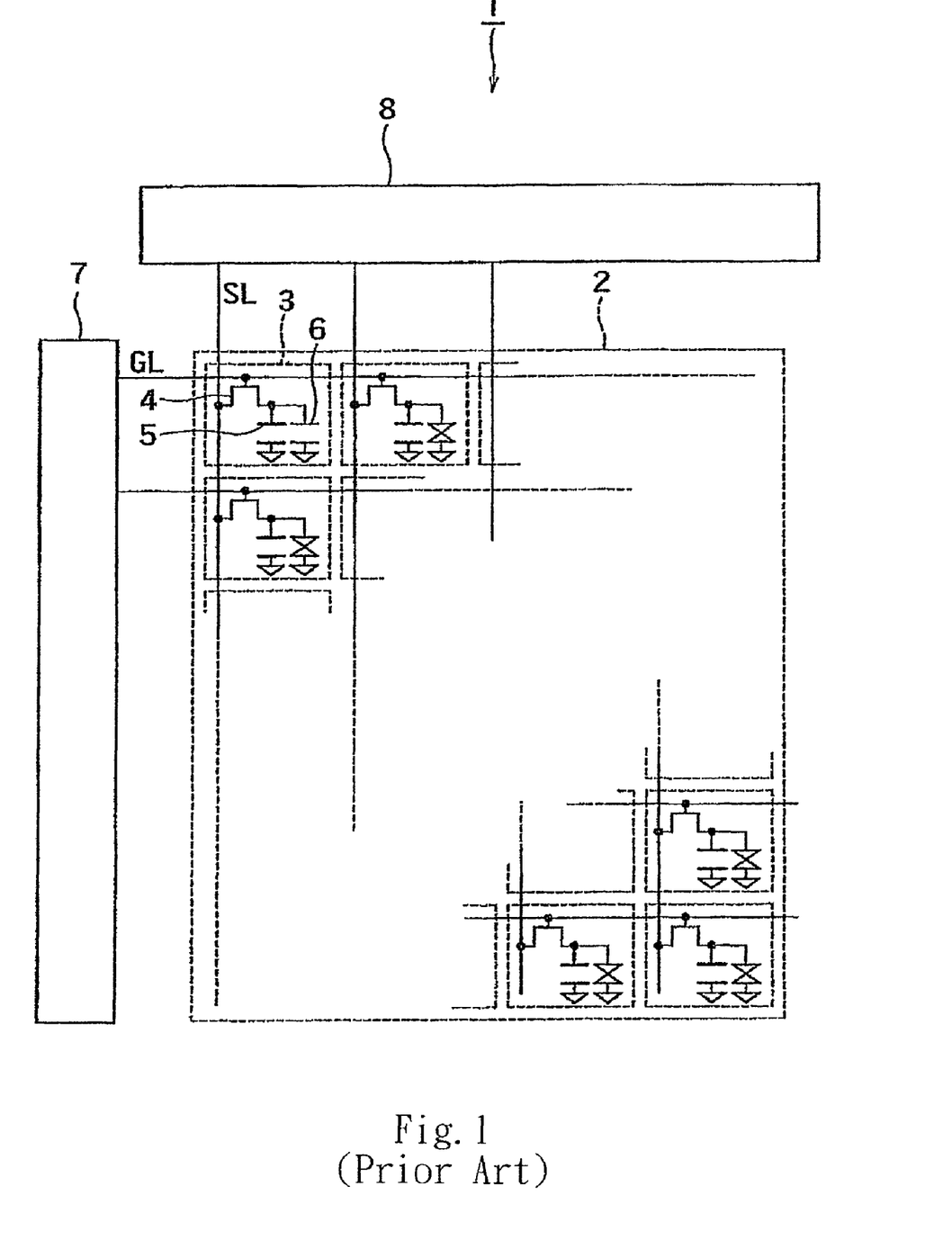
FIG. 1 is a block diagram showing the outline structure of a conventional liquid crystal display device.

FIG. 1 shows a structure of a conventional liquid crystal display device 1, which comprises liquid crystal cells 3 in a matrix form corresponding to pixels to constitute a liquid crystal cell array 2 as a display unit, and a gate line driving circuit 7 and a source line driving circuit 8 for driving the liquid crystal cell array 2.

The liquid crystal cell 3 is formed by a liquid crystal element 5 connected between the drain of a thin film transistor 4 and a ground as a capacitor and an auxiliary capacitor 6 connected therewith in parallel. The gate of the thin film transistor 4 is connected to a gate line GL and the source of the thin film transistor 4 is connected to a source line SL. In addition, the gate line driving circuit sequentially drives the gate lines GL respectively connected to the thin film transistors 4 of a row of the liquid crystal cells 3 corresponding thereto. Furthermore, the source line driving circuit provides a voltage signal to the source line SL, which is co-connected to the sources of the thin film transistors of each column of the liquid crystal cells.

Figure 2:
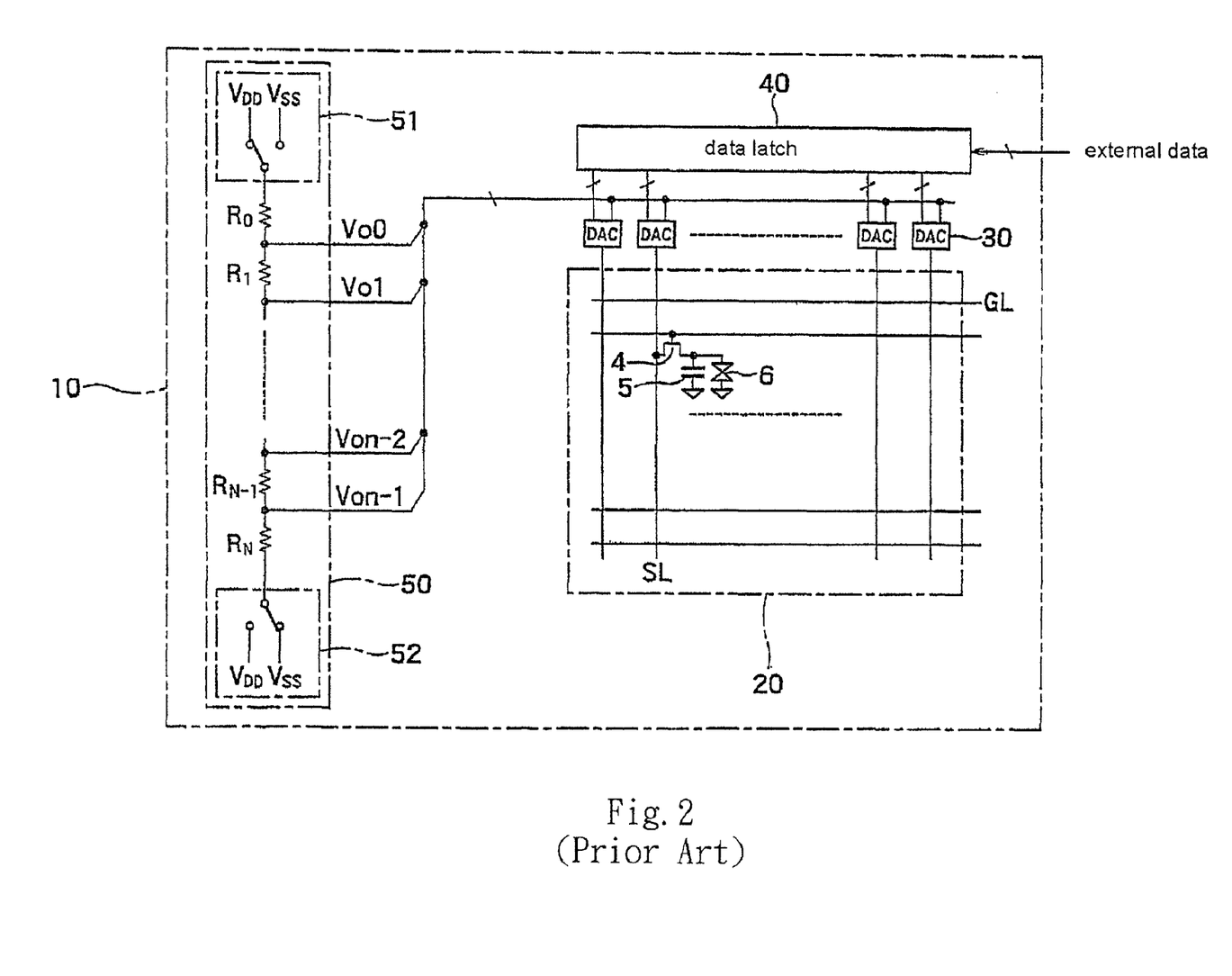
FIG. 2 is a block diagram showing an LCD module, which is the primary part of the conventional liquid crystal display device, suitable for the present invention.

FIG. 2 shows a LCD module 10 as a primary part of the conventional liquid display device, for which the present invention is to be applied onto. This LCD module 10 has cell array 20 with liquid crystal cells being formed in a matrix form (corresponding to the portion designated as numeral 2 in FIG. 1). The relationship of the cell array 20, a plurality of gate lines GL, a plurality of source lines SL, and thin film transistors provided on the intersection of the gate lines GL and the source lines SL as well as liquid crystal elements is as shown in FIG. 1.

For the gate lines GL, the gate line driving circuit (not shown) sequentially provides an analog voltage to each gate line GL. A digital-analog converter DAC is provided at one side (the top side in FIG. 2) of each of the source lines SL. A voltage signal from a γ voltage generator 50 described below and a signal from a data latch 40 used for latching digital data from external are respectively inputted to the digital-analog converter DAC.

In the γ voltage generator 50, switching circuits 51 and 52 has either of power source voltage Vdd or the ground voltage Vss complementarily connected to, and (n+1) resistors R0~RN are serially connected in between, n resistively divided γ voltage values are extracted from intermediate connecting nodes between the serially-connected resistors. The γ voltage values are provided to the digital-analog converter DAC in a bus and are digitized by the DAC according to the selecting data from the data latch, and then are provided to the source lines. The two switching circuits 51 and 52 can invert the polarity of the voltages applied to the resistor row by switch to the respective opposite sides of the switching circuits 51 and 52, which causes the inversion of the driving polarity of the liquid crystals.

The γ voltage generator 50 is constituted by the serially-connected resistors and the intermediate connecting nodes between the serially-connected resistors. The γ voltage value obtained therefrom is fixed.

Example 1

Figure 3:
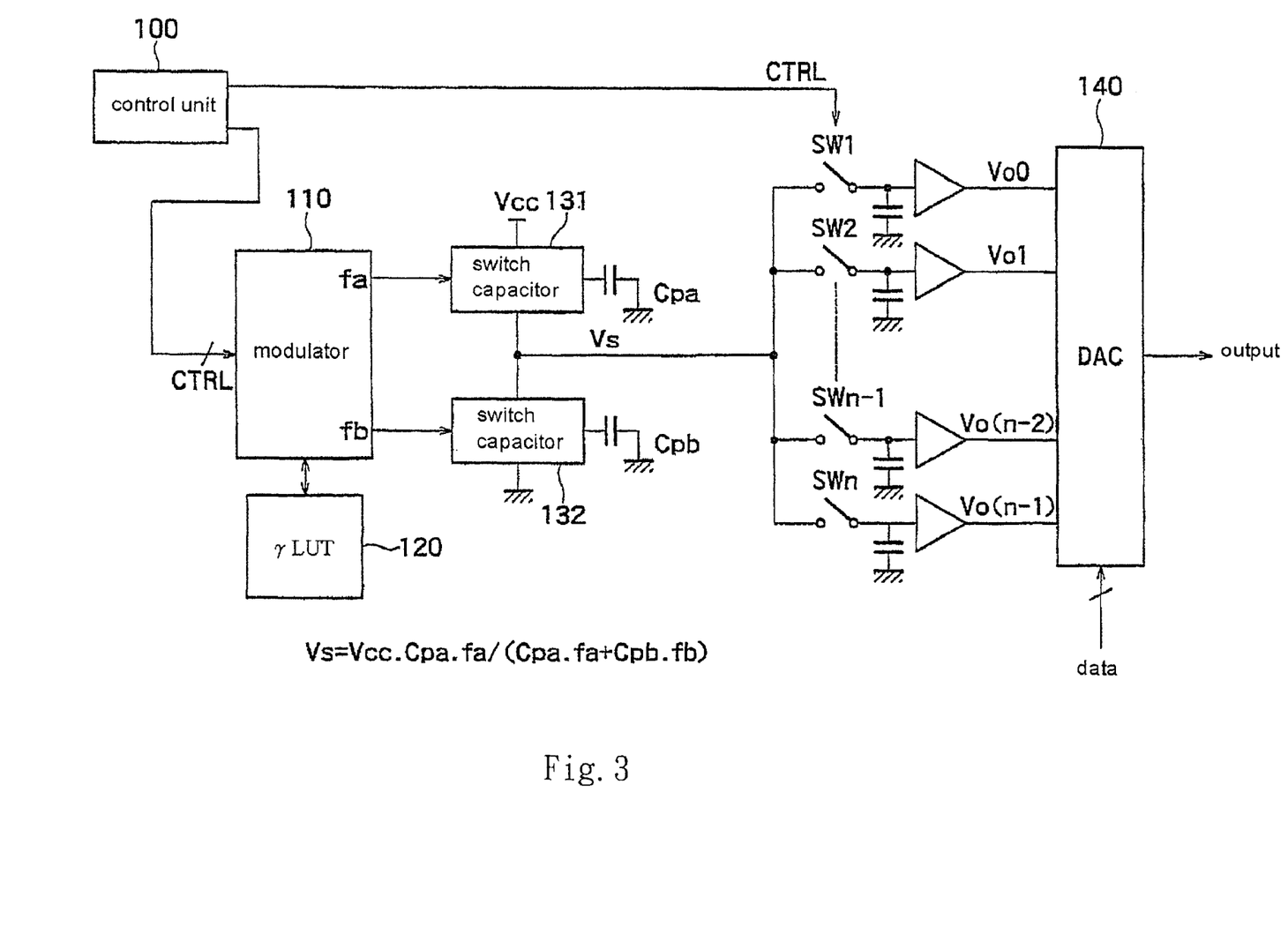
FIG. 3 is a circuit diagram of the digital-analog converter circuit of the present invention.

FIG. 3 is a circuit diagram of the digital-analog converter circuit of the present invention, in which the structures providing the applied voltages to the liquid crystal elements in FIG. 2 are mostly replaced.

A modulating device such as a modulator 110 supplied with control signals CTRL generated from a control unit 100 outputs two frequency signals fa and fb referring to a storage device such as a γ look-up table (LUT) 120, which stores the γ value of the desired γ curve according to the value of the control signal CTRL. These frequency signals fa and fb are provided to the two switch capacitors 131 and 132, which are serially connected between a power source Vcc and ground. The frequency signals fa and fb are used to control the two switch capacitors 131 and 132. The two switch capacitors 131 and 132 compose a variable resistance device, wherein the variable resistance device also can be a switch and a fixed resistor connected in series.

Figure 4:
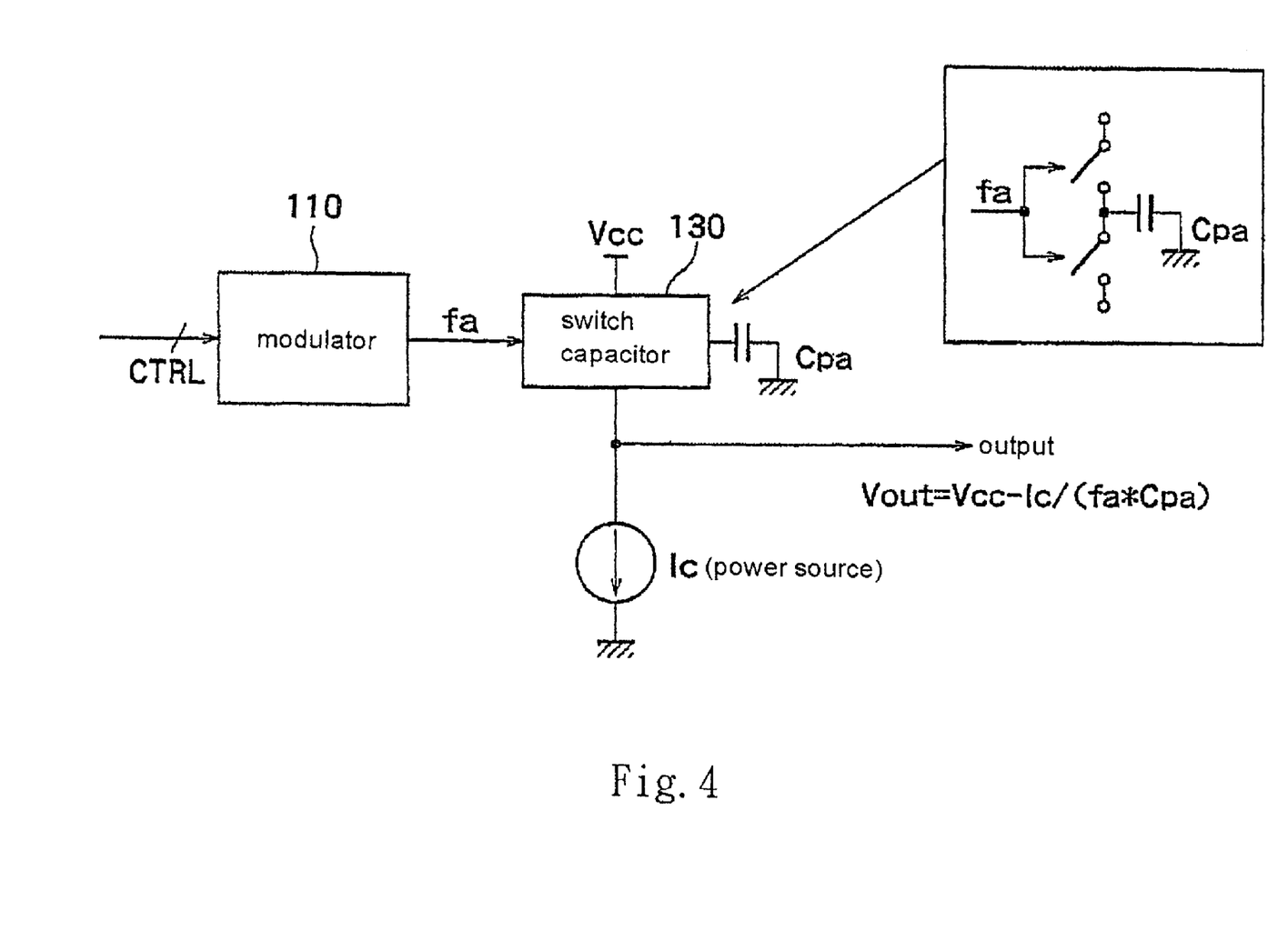
FIG. 4 is a block diagram for showing the basic operation of switch capacitors of the present invention.

The operation of the switch capacitor will be explained here. FIG. 4 is a block diagram explaining the basic operation of the switch capacitor 130, which is a part of the digital-analog converter circuit shown in FIG. 3. One terminal is the capacitor Cpa that connected to the ground, the other terminal is replaced by a current source and power source voltage Vcc, and a switch switch-connected by the frequency fa is provided. The current source generates a constant current Ic. The frequency fa is given by the modulator, which modulates by the control signal CTRL.

An output voltage Vout is taken out from a connecting node between the current source and the switch nearby one side thereof. The value of the output voltage is expressed as:

$$Vout = Vcc - Ic/(fa*Cpa)$$

The output voltage Vout is changed by changing the frequency fa outputted from the modulator. Moreover, the same operation also can be achieved by fixed resistors instead of the low current source.

In the structure of FIG. 3, the two switch capacitors each driven by different frequencies are serially connected, and an output voltage Vs appears in an intermediate node therebetween having the following value:

$$Vs = Vcc \cdot Cpa \cdot fa/(Cpa \cdot fa + Cpa \cdot fb)$$

According to time sequence which is the same as the period of frequency ratio fa/fb outputted by the modulator, the voltage passes though the turned off switches SW1~SWn sequentially. Then, this voltage passes through one of corresponding holding device that provided between the output sides of the switches and the grounds, and is supplied to the digital-analog converter DAC as source voltages Vo0~Vo(n−1). The holding device can be a sampling-hold circuits consisted of capacitors and buffers, Moreover, the switches and the sampling-hold circuits are disposed corresponding to the source lines. The digital-analog converter DAC selects the source voltage in accordance with the desired γ value determined by digital data provided to the digital-analog converter. The source voltage is provided to the source line corresponding thereto.

Figure 5:
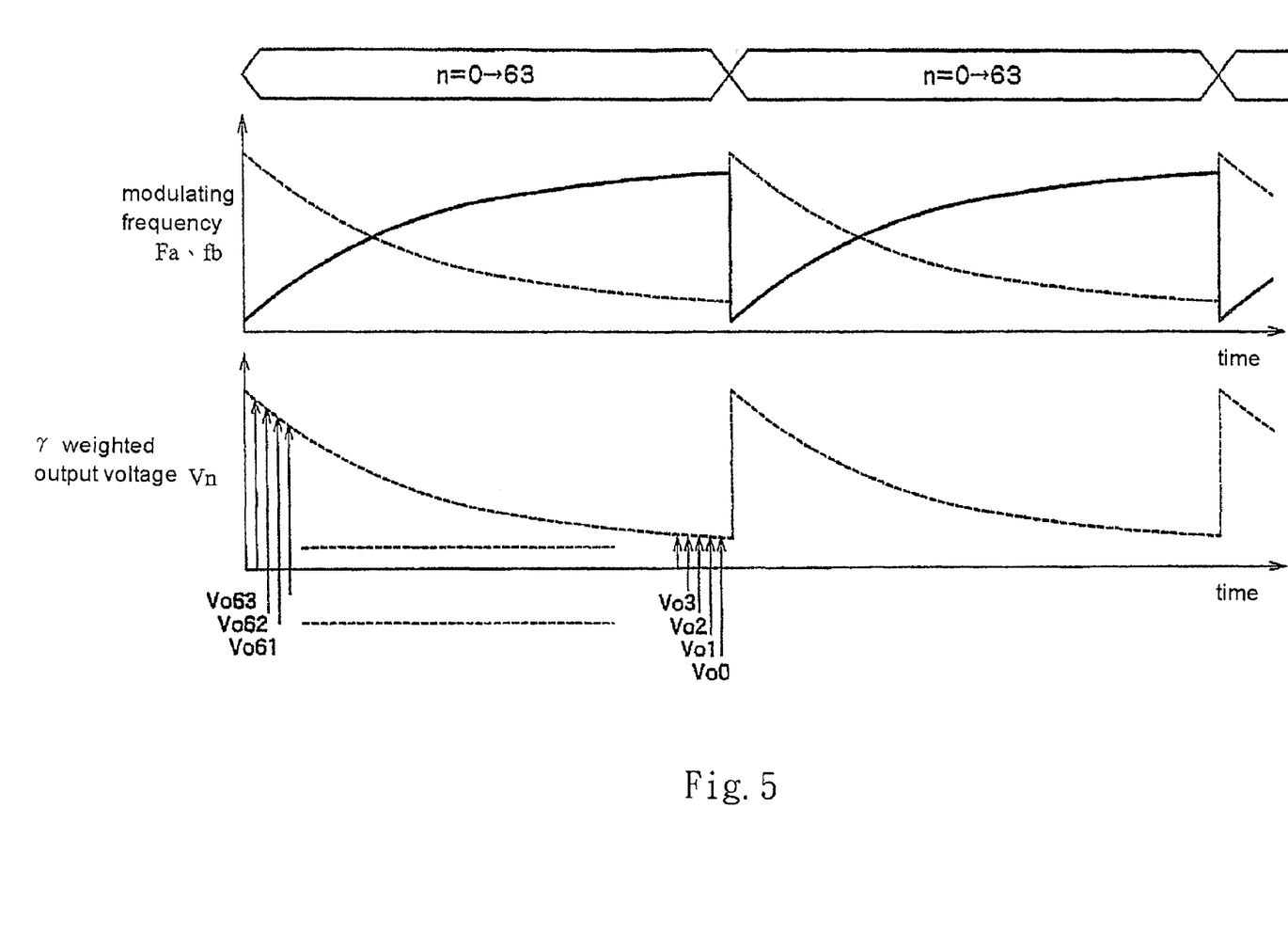
FIG. 5 is a graph showing the relationship of the change in the modulating frequency and the γ weighted output voltage of the present invention.

FIG. 5 is a graph showing the relationship of the change in the modulating frequency and the γ-weighted output voltage, in which the frequency output fa modulated by the modulator referring to the γ look-up table is shown in solid lines, and the frequency output fb is shown by dashed lines. By representing the γ curve as the value of 64, and making the data n changeable from 0 to 63, the combination of the modulating frequencies fa and fb according to the γ curve of the γ look-up table can be obtained, and it has been shown that the γ weighted output voltage Vo0~Vo (n−1) can be obtained by the foresaid Vs formula.

Figure 6:
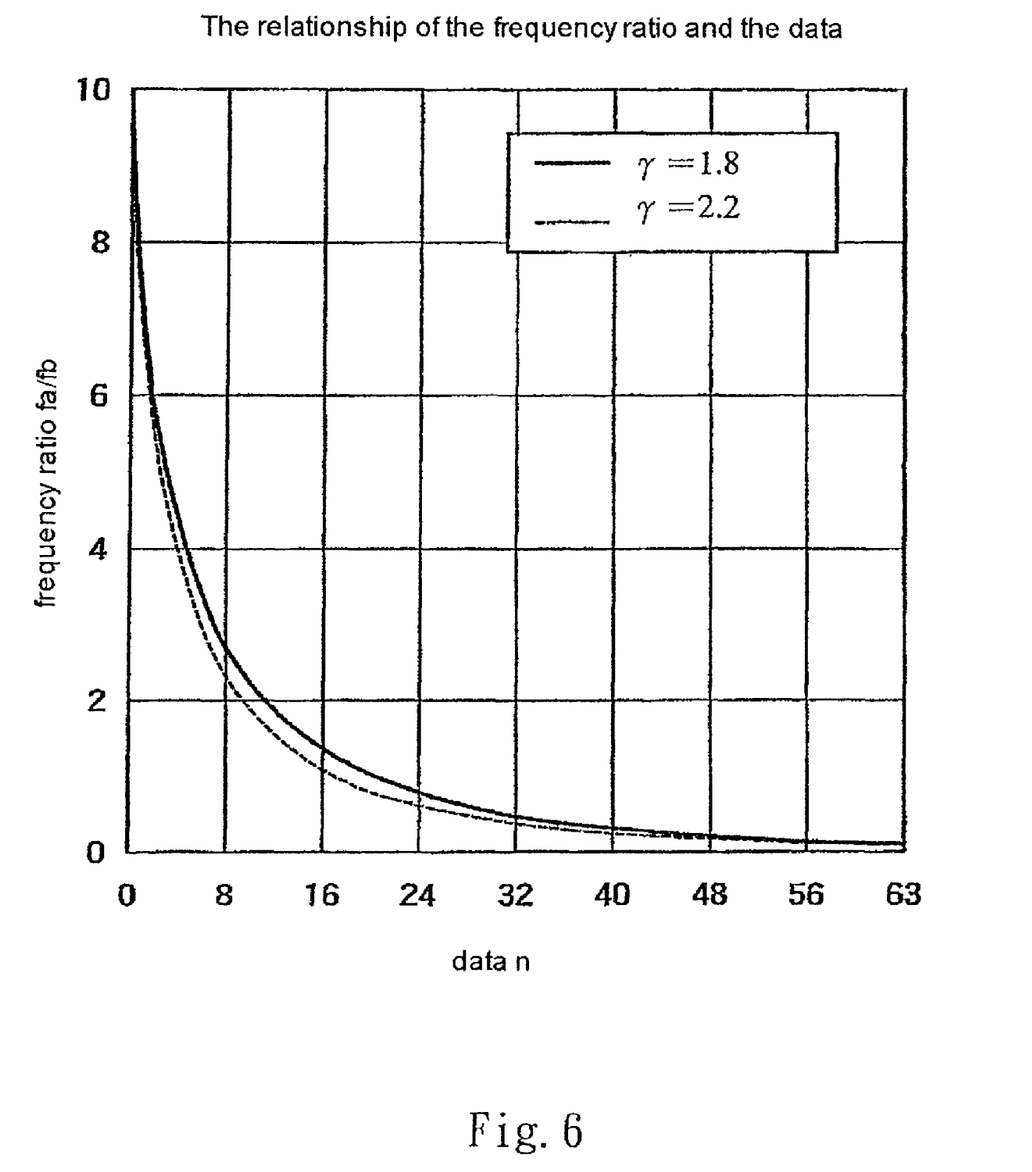
FIG. 6 is a graph showing the relationship of the data n and the ratio of the two frequencies fa/fb.

FIG. 6 is a graph showing the relationship of the data n and the ratio of two frequencies fa/fb. Modulator chooses a value in table 120 in response to the predetermined value of data n and outputs a ratio of two frequencies fa/fb. The fa decreases and fb increases when the data n increases as shown in FIG. 5. Take γ=1.8 as an example, the ratio of the frequency fa/fb is 9 when n=0, and decreases rapidly at the initial time, then the decrease of the ratio slows down, and producing a curve slowly approaching the value of 0.

Figure 7:
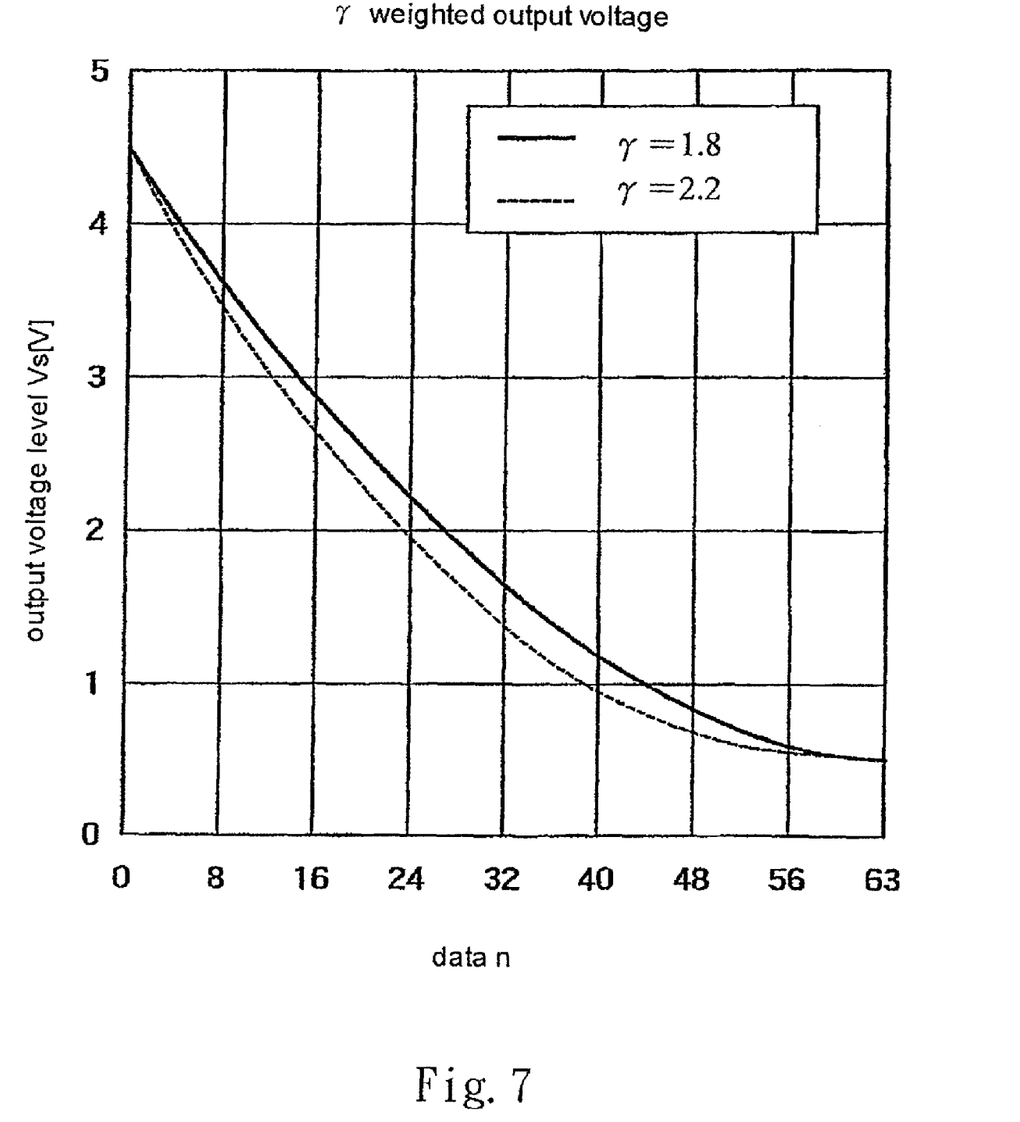
FIG. 7 is a graph showing the changes of the output voltage Vs in FIG. 3 when the data n is changed.

FIG. 7 is a graph showing the change of the output voltage Vs of FIG. 3 when the data n is changed. The obtained data n specific to the respective source line is provided to the source line corresponding thereto.

Example 2

Figure 8:
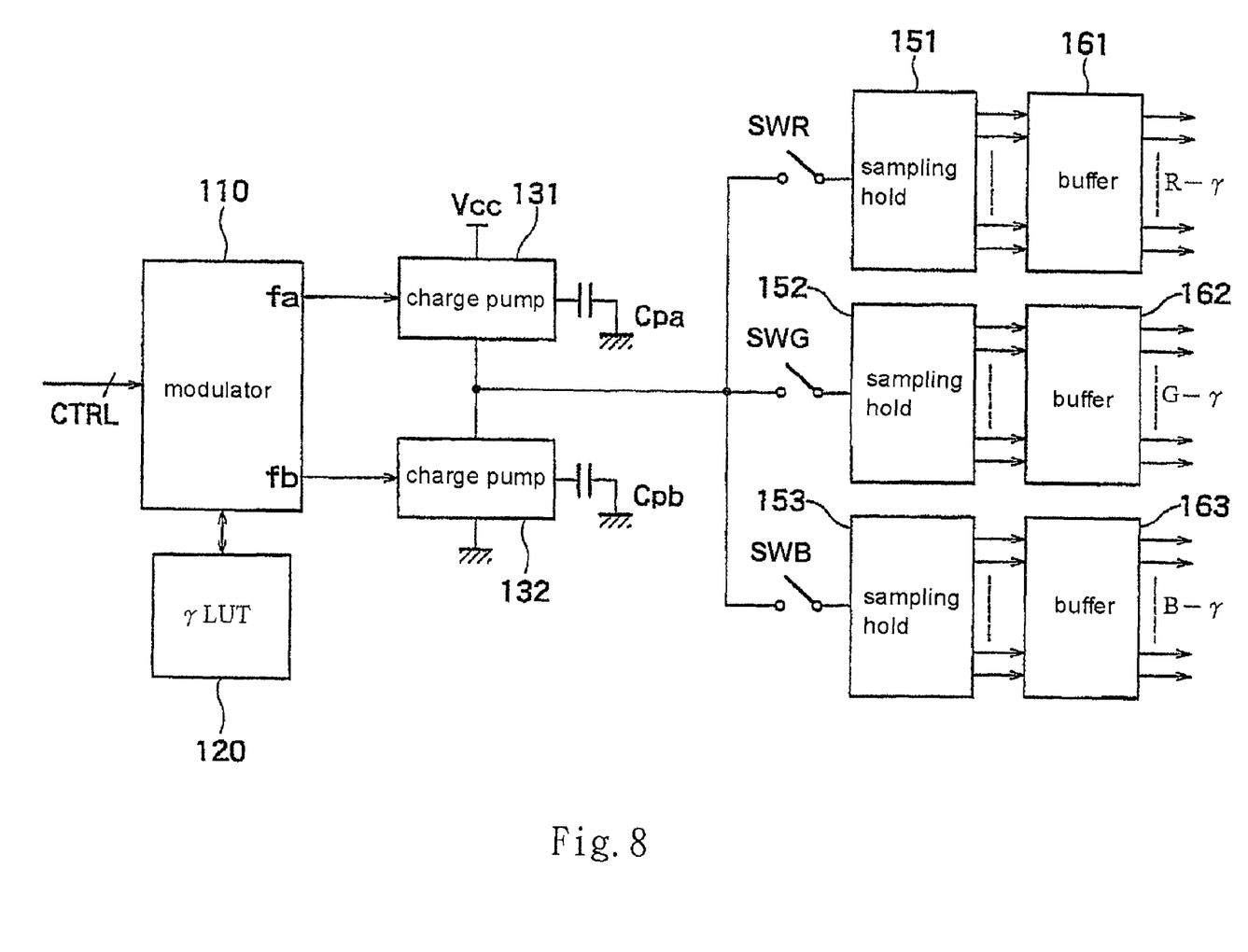
FIG. 8 is a block diagram showing a digital-analog converter circuit in accordance with second example of the present invention, from which the γ weighted output voltages for each of the 3 colors are obtained.
Figure 9:
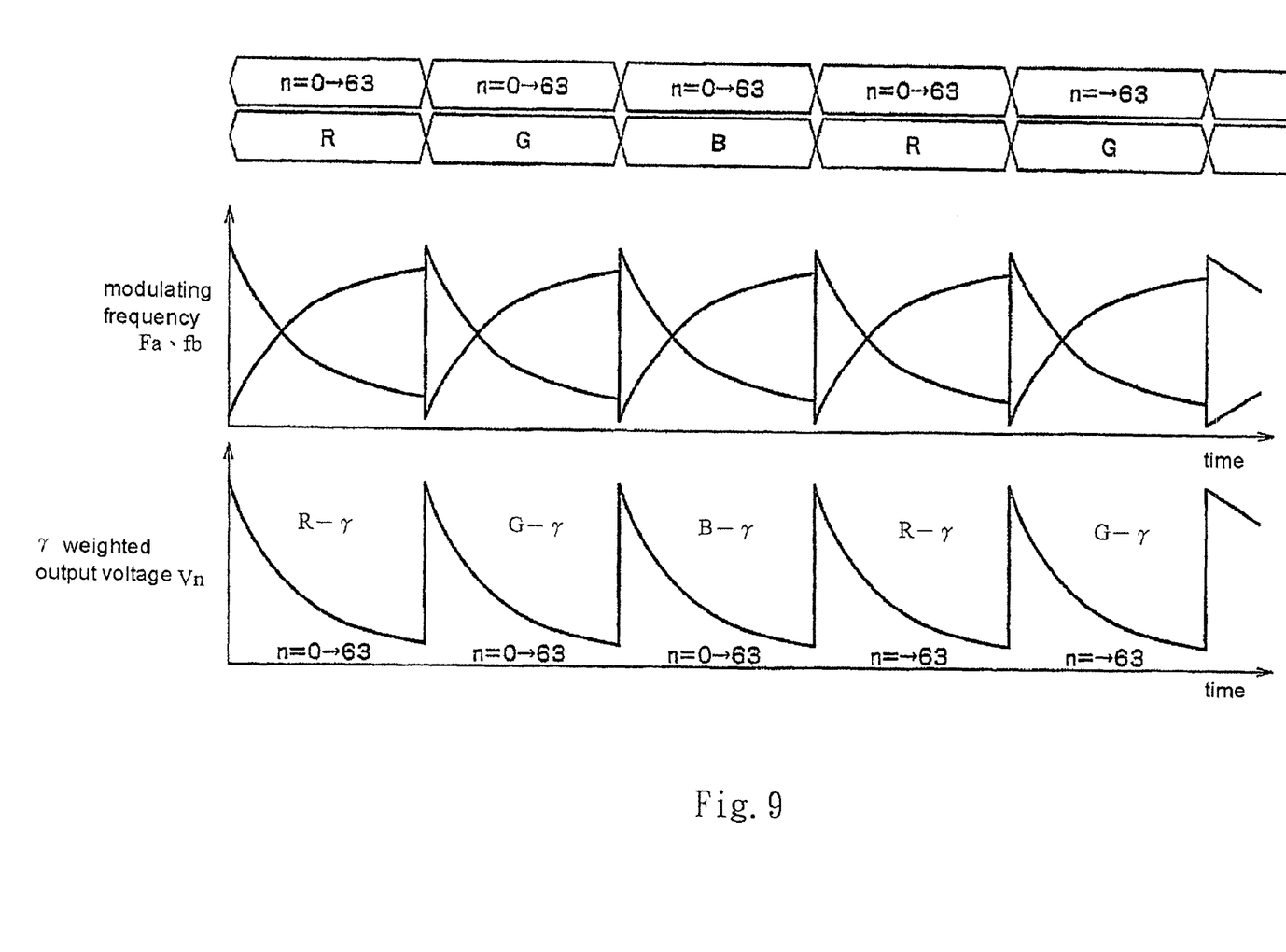
FIG. 9 is a graph showing the operation of the second example of the present invention.

FIG. 8 is a block diagram showing the digital-analog converter circuit in accordance with second example of the present invention, in which the γ weighted output voltages for the three different colors are obtained. FIG. 9 is a graph showing its operation. In this example, three holding device are provided, and switches SWR, SWG, SWB are provided and sequentially selected in accordance with the time divisions as shown in FIG. 9.

In the FIG. 8, the switches of SW1 to SWn and capacitors in FIG. 3 are shown as sampling-hold circuits 151~153. The required voltage outputs corresponding to obtained data for the respective colors pass through the respective buffer 161~163 and then are supplied to DAC 140.

The operation for one color is totally the same as the operation shown in FIG. 3. When observing one pixel, the appropriate γ weighted output voltages for the respective three colors are provided to the respective source lines.

Example 3

Figure 10:
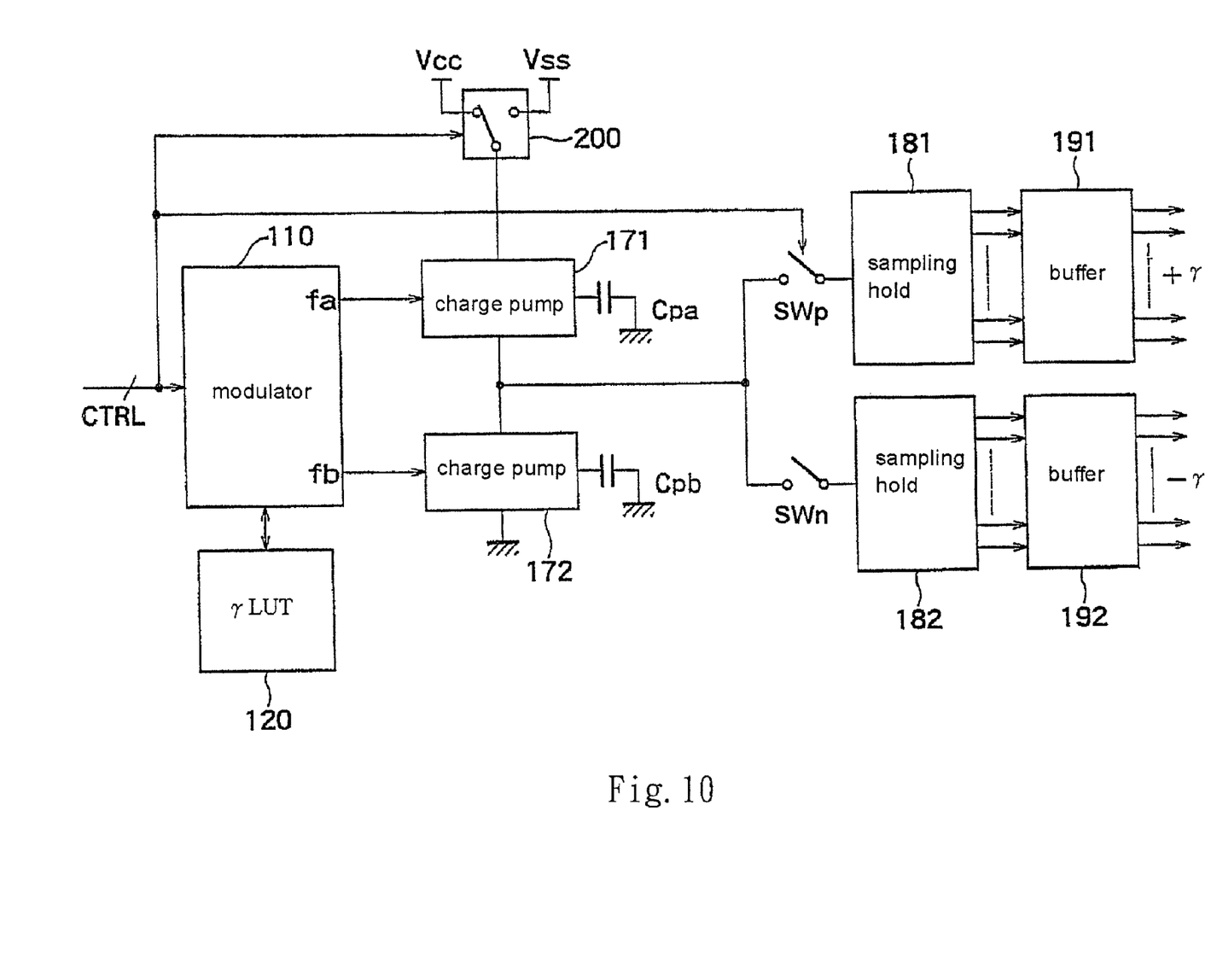
FIG. 10 is a block diagram showing a digital-analog converter circuit in accordance with third example of the present invention.

FIG. 10 is a block diagram showing a digital-analog converter circuit in accordance with third example of the present invention, which is suitable as a device displaying by inverting polarity during each frame to eliminate residue image.

In the FIG. 10, the digital-analog converter circuit that compare with the FIG. 3 has two charge pumps 171, 172 instead of the two switch capacitors. A switch device 200 for switching power source voltages between Vss and Vcc and supplying to charge pumps 171, 172, switches SWp and SWn, sampling-hold circuits 181, 182 and buffers 191, 192 are provided. The switches SWp and SWn select and output the outputs obtained from the charge pumps respectively when the polarity is switched.

Figure 11:
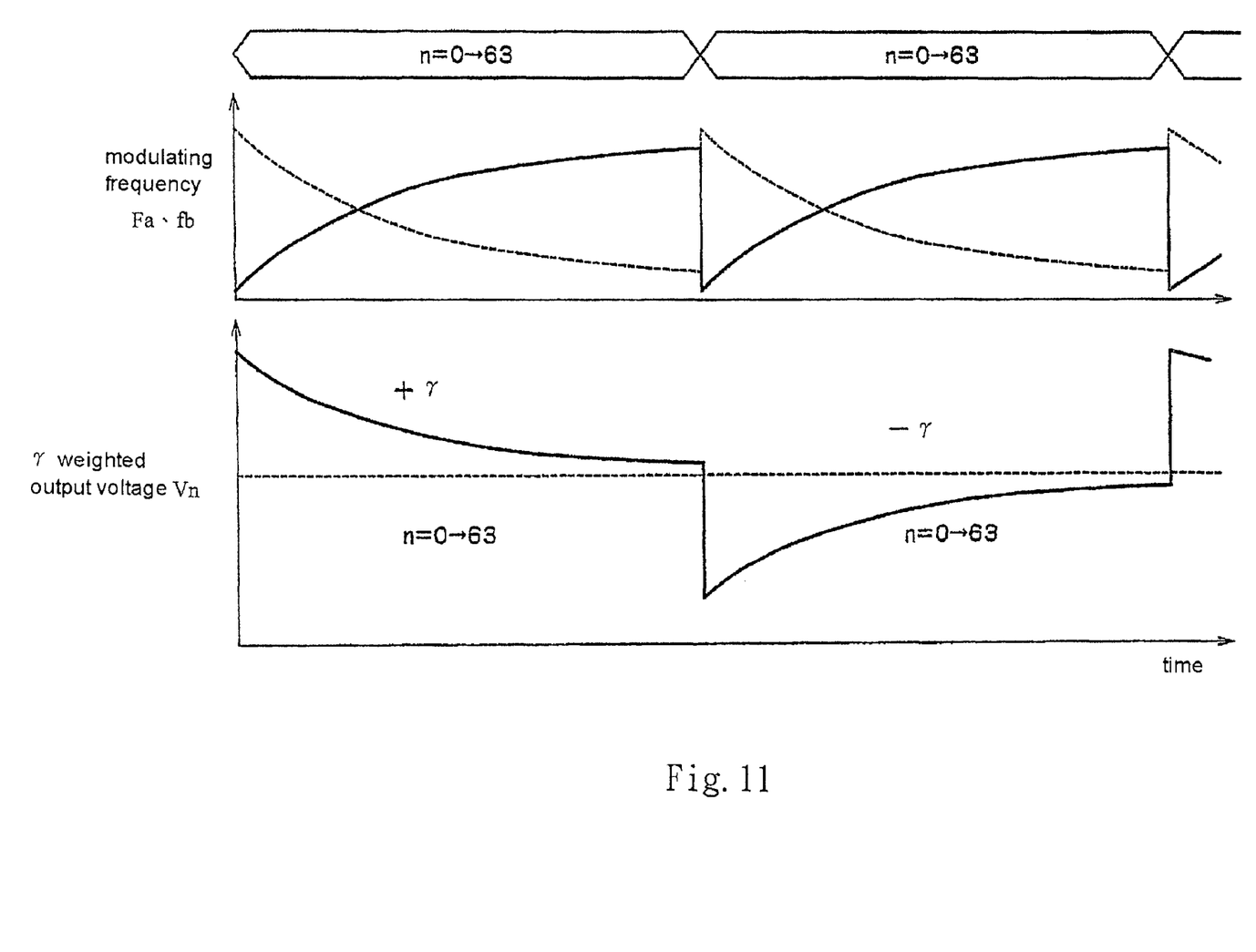
FIG. 11 is a graph showing the operation of the third example of the present invention.

FIG. 11 is a graph showing the operation of the third example shown in FIG. 10. At the initial period, Vcc is selected by the switch 200, and operation as the same as shown in FIG. 5 is proceeded, the γ weighted output voltage is obtained and outputted through the closed switch SWp, sampling-hold circuit 181 and buffer 191. In the next period, Vss is selected by the switch 200, and then the polarity is inverted. The γ weighted output voltage outputted from modulator 11 is increased with the change of data n from the negative voltage. The output voltage is outputted through switch SWn, sampling-hold circuit 181 and buffer 191.

The examples mentioned above are merely exemplifications; therefore various modifications are also possible and covered by this invention. For example, it is possible to extract the best γ voltage of transmissive-mode and reflective-mode.

Although the digital-analog converter circuit has been explained on the premise of being used in liquid display devices above, digital-analog converter circuit of such kind in the present invention is also suitable as a part of the source line driving circuit in the liquid display device.

Figure 12:
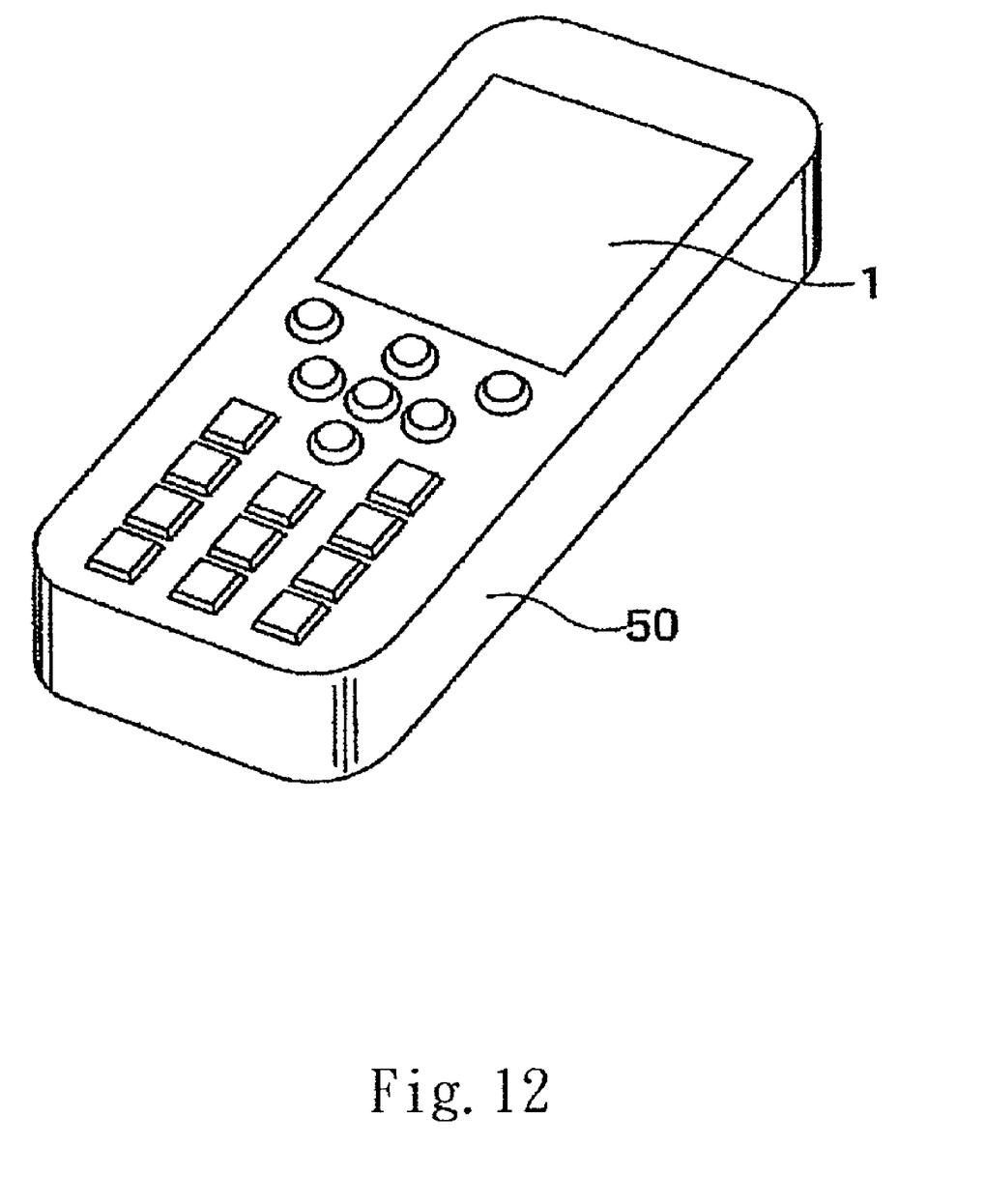
FIG. 12 is a perspective diagram showing another example of a mobile phone device in which the liquid crystal display device containing the digital-analog converter circuit of the present invention is applied.

In addition, although the liquid display device of such kind is suitable as the display device 1 in the mobile phone device 50 as shown in FIG. 12, it is not limited to mobile phones, but also suitable in electronic devices such as any of digital camera, personal digital assistant (PDA), notebook computer, desktop computer, television, automobile display, or portable DVD player.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital-analog converter circuit comprising:
   a storage device storing a voltage characteristic curve;
   a modulating device generating a frequency signal in accordance with a data from the voltage characteristic curve stored in the storage device in response to a selected data;
   a variable resistance device connected between a first power source and a second power source, in which the resistance value of the variable resistance device is changed in accordance with the frequency signal from the modulating device;
   a holding device holding a voltage generated at the variable resistance device; and
   an output device outputting the voltage to a desired output end.

2. The digital-analog converter circuit according to claim 1, wherein the variable resistance device comprises two switch capacitors in which the voltage is extracted from an intermediate node between the two switch capacitors.

3. The digital-analog converter circuit according to claim 2, wherein one of the switch capacitors is replaced by a current source.

4. The digital-analog converter circuit according to claim 2, wherein the modulating device in accordance with the selected data provides two frequency signals with varied frequency ratio to the two switch capacitors.

5. The digital-analog converter circuit according to claim 1, wherein the variable resistance device has a switch capacitor and a fixed resistor connected in series, and the voltage is extracted from a connecting node between the switch capacitor and the fixed resistor.

6. The digital-analog converter circuit according to claim 1, wherein the holding device is a sampling-hold circuit.

7. The digital-analog converter circuit according to claim 6, wherein the sampling-hold circuit has a buffer.

8. The digital-analog converter circuit according to claim 1, wherein the number of holding device depends on the number of the extracted output voltages and the holding device are respectively connected to the variable resistance device by sequentially turning on respective switches of the same number corresponding thereto.

9. The digital-analog converter circuit according to claim 1, further comprising a switch device, which reversibly connects the first and the second power source for the variable resistance device, and is structured as a switch to select one of the two power source according to a switch signal from the switch device, and switch two system of the holding device.

10. The digital-analog converter circuit according to claim 1, wherein the voltage extracted from the variable resistance device is provided to the holding device through three switches which is selected by time-sharing, wherein the holding device comprises three systems according to three colors.

11. A liquid crystal display device comprising:
    a liquid crystal element array having a plurality of gate lines, a plurality of source lines, a plurality of thin film transistors respectively provided at intersections of the gate lines and the source lines, a gate of each of the thin film transistors is connected to one of the gate lines corresponding thereto, a source of the thin film transistor is connected to one of the source lines corresponding thereto and a drain of the thin film transistor is connected to one of the liquid crystal elements corresponding thereto;
    a gate line driving device driving the gate lines; and
    a source line driving device driving the source lines, wherein the source line driving device including the digital-analog converter circuit according to claim 1.

12. An electronic device, comprising:
    the liquid crystal display device according to claim 11;
    wherein the electronic device is mobile phone device, digital camera, personal digital assistance (PDA), notebook computer, desktop computer, television, automobile display, or portable DVD player.

* * * * *